United States Patent
Choi et al.

(10) Patent No.: US 10,043,585 B2
(45) Date of Patent: Aug. 7, 2018

(54) SHIFT REGISTER UNIT, GATE DRIVE DEVICE, DISPLAY DEVICE, AND CONTROL METHOD

(71) Applicant: BOE TECHNOLOGY GROUP CO., LTD., Beijing (CN)

(72) Inventors: Hyun Sic Choi, Beijing (CN); Seung Woo Han, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/532,605
(22) PCT Filed: Sep. 28, 2016
(86) PCT No.: PCT/CN2016/100657
§ 371 (c)(1),
(2) Date: Jun. 2, 2017
(87) PCT Pub. No.: WO2017/067376
PCT Pub. Date: Apr. 27, 2017

(65) Prior Publication Data
US 2017/0345516 A1   Nov. 30, 2017

(30) Foreign Application Priority Data
Oct. 20, 2015  (CN) .......................... 2015 1 0684372

(51) Int. Cl.
*G09G 3/36*   (2006.01)
*G11C 19/18*  (2006.01)
(Continued)

(52) U.S. Cl.
CPC ......... *G11C 19/186* (2013.01); *G09G 3/2092* (2013.01); *G09G 3/3677* (2013.01);
(Continued)

(58) Field of Classification Search
None
See application file for complete search history.

(56) References Cited

U.S. PATENT DOCUMENTS

2007/0046327 A1*  3/2007  Wei .................. G11C 19/28
                                                  326/46
2009/0304138 A1* 12/2009  Tsai ................. G11C 19/28
                                                  377/79
(Continued)

FOREIGN PATENT DOCUMENTS

CN    102654986 A    9/2012
CN    102867543 A    1/2013
(Continued)

OTHER PUBLICATIONS

International Search Report and Written Opinion dated Dec. 27, 2016; PCT/CN2016/100657.
(Continued)

*Primary Examiner* — Christopher R Lamb
(74) *Attorney, Agent, or Firm* — Ladas & Parry LLP (57) ABSTRACT

A shift register unit and a control method thereof, a gate drive device including the shift register unit, and a display device. The shift register unit includes: an input module, a pull-up module, a first pull-down control signal generation module, controlling, in the period that a first signal is high level, potential of a first pull-down control node according to a drive input signal and potential of a pull-up control node; a second pull-down control signal generation module, controlling, in the period that a second signal is high level, potential of a second pull-down control node according to the drive input signal and the potential of the pull-up control node, the first signal and the second signal alternatively becoming high level; and a pull-down module, pulling down a drive output signal according to the potential of the first pull-down control node and the potential of the second pull-down control node.

20 Claims, 7 Drawing Sheets

(51) Int. Cl.
*G09G 3/20* (2006.01)
*G11C 19/28* (2006.01)

(52) U.S. Cl.
CPC ... *G11C 19/287* (2013.01); *G09G 2310/0286* (2013.01); *G09G 2330/028* (2013.01)

(56) References Cited

U.S. PATENT DOCUMENTS

| | | | | |
|---|---|---|---|---|
| 2011/0234577 A1* | 9/2011 | Yang | ................... | G09G 3/3677 345/212 |
| 2014/0111403 A1* | 4/2014 | Kim | ...................... | G11C 19/28 345/76 |
| 2014/0119493 A1* | 5/2014 | Yang | ...................... | G11C 19/28 377/64 |

FOREIGN PATENT DOCUMENTS

| | | | |
|---|---|---|---|
| CN | 103730089 | A | 4/2014 |
| CN | 103761937 | A | 4/2014 |
| CN | 104392704 | A | 3/2015 |
| CN | 104517571 | A | 4/2015 |
| CN | 105139825 | A | 12/2015 |
| CN | 205028636 | A | 2/2016 |
| JP | 2008-140489 | A | 6/2008 |
| KR | 101286539 | B1 | 7/2013 |

OTHER PUBLICATIONS

The First Chinese Office Action dated Mar. 20, 2017; Appln. No. 201510684372.5.

\* cited by examiner

Fig.9 of a shift register unit and a control method thereof, a gate driving device comprising the shift register unit, and a display device comprising the gate driving device.

SHIFT REGISTER UNIT, GATE DRIVE DEVICE, DISPLAY DEVICE, AND CONTROL METHOD

TECHNICAL FIELD

The present disclosure relates to a shift register unit and a control method thereof, a gate driving device comprising the shift register unit, and a display device comprising the gate driving device.

BACKGROUND

At present, a display device is applied widely. In a thin film transistor-liquid crystal display (TFT-LCD), gate driving signals are provided to gates of respective thin film transistors of a pixel region by a gate driving device. In technique of gate driver on array or gate on array (GOA), the gate driving device is formed on an array substrate of a liquid crystal display by array technology, so that the cost can be reduced and processes are simplified.

The gate driving device formed by the GOA technique comprises a plurality of shift register units, each of which is connected with a gate line of a thin film transistor of a pixel region. Specifically, the respective shift register units are connected with the gate lines of the thin film transistors of the pixel region formed by rows, and controlling turning on/turning off and so on is carried out on thin film transistors of corresponding rows by driving output signals output by the respective shift register units. For example, when a certain shift register unit outputs a driving output signal at a high level, thin film transistors of a row connected thereto are turned on. Then, the turned-on thin film transistors of the row controls brightness according to a signal output by a data driving device.

As described above, in the display device, when the shift register unit cannot operate normally, the display device cannot display normally. Therefore, requirement for the stability of the shift register unit becomes higher.

SUMMARY

There are provided in the present disclosure a shift register unit and a control method thereof, a gate driving device comprising the shift register unit, and a display device comprising the gate driving device, which are capable of improving the stability of the gate driving circuit thereby displaying reliably.

According to a first aspect of the present disclosure, there is provided a shift register unit. The shift register unit comprises: an input module, connected with a driving input signal input terminal, a clock signal input terminal, and a pull-up control node and configured to control potential of the pull-up control node according to a driving input signal and a clock signal; a pull-up module, connected with a high level direct current signal input terminal, the pull-up control node, and a driving output signal output terminal and configured to pull up a driving output signal according to the potential of the pull-up control node; a first pull-down control signal generation module, connected with a first signal input terminal, the driving input signal input terminal, the pull-up control node, and a first pull-down control node and configured to control potential of the first pull-down control node according to the driving input signal and the potential of the pull-up control node during a period that a first signal is at a high level; a second pull-down control signal generation module, connected with a second signal input terminal, the driving input signal input terminal, the pull-up control node, and a second pull-down control node and configured to control potential of the second pull-down control node according to the driving input signal and the potential of the pull-up control node during a period that a second signal is at a high level, wherein the first signal and the second signal become the high level alternatively; and a pull-down module, connected with the first pull-down control node and the second pull-down control node and configured to pull down the driving output signal according to the potential of the first pull-down control node and the potential of the second pull-down control node.

According to a second aspect of the present disclosure, there is provided a gate driving device. The gate driving device comprises: N shift register units as described above, where N is a natural number greater than 1. A driving input signal input terminal of an n-th shift register unit is connected with a driving output signal output terminal of a (n−1)-th shift register unit, where 1<n<=N. A driving input signal input terminal of a first shift register unit is connected with an output terminal of a start signal.

According to a third aspect of the present disclosure, there is provided a display device. The display device comprises a display panel; and the gate driving device configured to output a driving output signal to the display panel.

According to a fourth aspect of the present disclosure, there is provided a control method applicable to the shift register unit as described above. The control method comprises: controlling potential of a pull-up control node according to a driving input signal and a clock signal; pulling up a driving output signal according to the potential of the pull-up control node; controlling potential of a first pull-down control node according to the driving input signal and the potential of the pull-up control node during a period that a first signal is at a high level; controlling potential of a second pull-down control node according to the driving input signal and the potential of the pull-up control node during a period that a second signal is at a high level, wherein the first signal and the second signal become the high level alternatively; and pulling down the driving output signal according to the potential of the first pull-down control node and the potential of the second pull-down control node.

The shift register unit and the control method thereof, the gate driving device comprising the shift register unit, and the display device comprising the gate driving device according to the present disclosure generate, the pull-down control signal used for controlling the pull-down module is generated by the first pull-down control signal generation module and the second pull-down control signal generation module alternatively, according to the first signal and the second signal. Therefore, the present disclosure is capable of avoiding effectively the pull-down module from aging which is caused by duty ratios of the first pull-down control node and the second pull-down control node being too high. Therefore, the stability of the shift register unit, the gate driving device and the display device can be improved.

DETAILED DESCRIPTION

Implementations of the present disclosure will be described below in detail by referring to figures. Descriptions are provided below by referring to the figures, so as to help understanding exemplary implementations of the present disclosure as defined in the Claims and their equivalents, and the descriptions comprise various specific details that help understanding, but they are just taken as exemplary. Therefore, those skilled in the art would recognize that various alternations and amendments can be made to the implementations described herein, without departing from the scope and spirit of the present disclosure. Furthermore, in order to make the specification clearer and simpler, detailed descriptions of functions and structures well known in the art would be omitted.

Sources and drains of thin film transistors adopted in the implementations of the present disclosure are symmetrical, and thus names of the sources and the drains can be exchanged with each other. In addition, the thin film transistors can be divided into N type transistors or P type transistors according to the characteristics of the thin film transistors. In the following description, the description is presented by taking the N type transistor as an example, but the P type transistors can also be adopted. Additionally, when the P type transistor is adopted, those skilled in the art are capable of adjusting input signals of respective input terminals according to the type of the transistors adopted.

Figure 1:
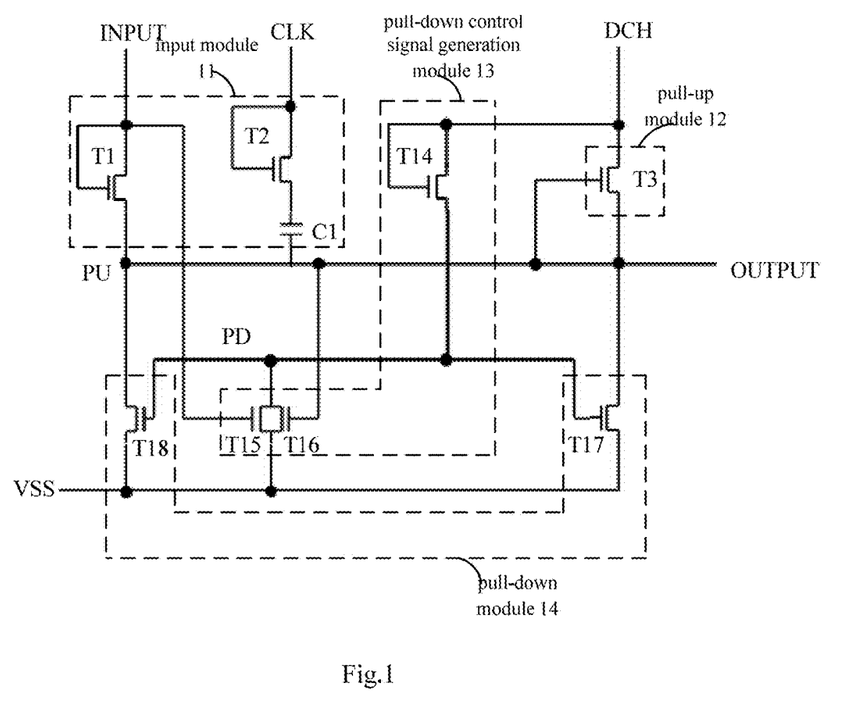
FIG. 1 is a circuit diagram of a shift register unit of a direct current (DC) driving mode applied in the present disclosure.
Figure 2:
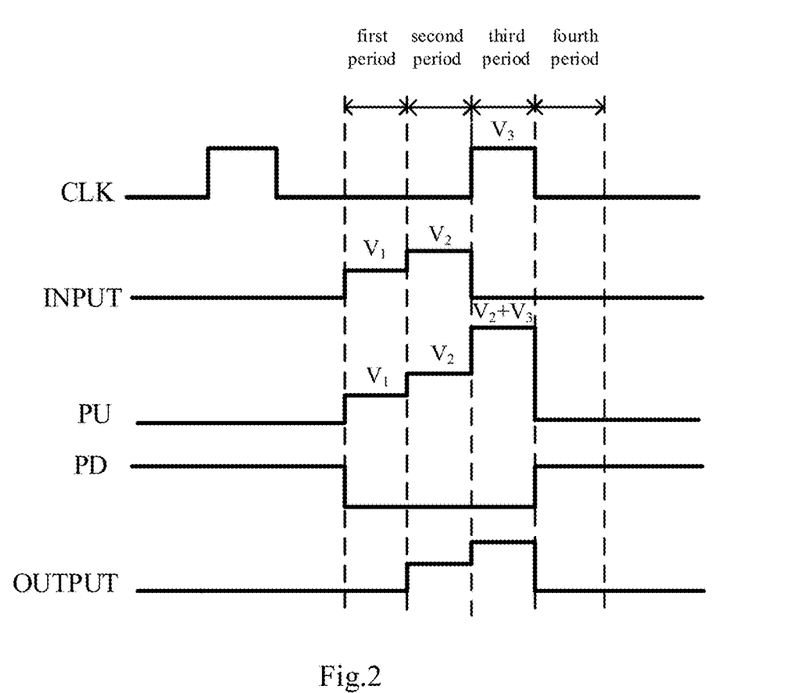
FIG. 2 is a waveform diagram of respective nodes in a circuit of the shift register unit as shown in FIG. 1.

First, a shift register unit in a direct current (DC) driving manner is described by referring to FIGS. 1 and 2. FIG. 1 is a circuit diagram of a shift register unit 1 in a direct current driving manner applied in the present disclosure. FIG. 2 is a waveform diagram of respective nodes in the circuit of the shift register unit 1 as shown in FIG. 1.

The shift register unit 1 as shown in FIG. 1 comprises an input module 11, a pull-up module 12, a pull-down control signal generation module 13 and a pull-down module 14.

The input module is connected with a driving input signal input terminal INPUT, a clock signal input terminal CLK, and a pull-up control node PU, and configured to control potential of the pull-up control node PU according to a driving input signal INPUT and a clock signal CLK.

Specifically, for example, the input module 11 can comprise: a first thin film transistor T1, whose drain and gate are connected with the driving input signal input terminal INPUT, and source is connected with the pull-up control node PU; a second thin film transistor T2, whose drain and gate are connected with the clock signal input terminal CLK; and a capacitor C1, whose one terminal is connected with a source of the second thin film transistor T2, and another terminal is connected with the pull-up control node PU.

When a signal of the driving input signal input terminal INPUT is at a high level, the first thin film transistor T1 is turned on. Thus, the signal of the driving input signal input terminal INPUT is delivered to the pull-up control node PU. Otherwise, when the signal of the driving input signal input terminal INPUT is at a low level, the first thin film transistor T1 is turned off, and thus the signal of the driving input signal input terminal INPUT cannot be delivered to the pull-up control node PU.

Likewise, when a signal of the clock signal input terminal CLK is at the high level, the second thin film transistor T2 is turned on. Thus, the signal of the clock signal input terminal CLK is delivered to the pull-up control node PU. Otherwise, when the signal of the clock signal input terminal CLK is at the low level, the second thin film transistor T2 is turned off, and thus the signal of the clock signal input terminal CLK cannot be delivered to the pull-up control node PU.

In addition, through the capacitor C1, the potential of the pull-up control node PU is capable of being controlled as a potential gained by adding the signal of the driving input signal terminal INPUT to the signal of the clock signal input terminal CLK.

As shown in FIG. 2, in first to second periods, since the signal of the clock signal input terminal CLK is at the low level, the second thin film transistor T2 is turned off, and thus the potential of the pull-up control node PU is the same as the potential of the signal of the driving input signal input terminal INPUT. In a third period, since the signal of the clock signal input terminal CLK is at the high level, the second thin film transistor T2 is turned on, and thus the potential of the pull-up control node PU is controlled as a potential gained by adding the signal of the driving input signal terminal INPUT to the signal of the clock signal input terminal CLK under the effect of the capacitor C1. It can be known from FIG. 2 that the potential of the pull-up control node PU in the third period is two times than the potential of the pull-up control node PU in the second period.

Returning to FIG. 1, the pull-up module 12 is connected with a high level direct current signal input terminal DCH, the pull-up control node PU, and a driving output signal output terminal OUTPUT, and configured to pull up a driving output signal according to the potential of the pull-up control node PU.

Specifically, for example, the pull-up module 12 can comprise a third thin film transistor T3, whose drain is connected with the high level direct current signal input terminal DCH, gate is connected with the pull-up control node PU, and source is connected with the driving output signal output terminal OUTPUT.

Alternatively, the third thin film transistor T3 is constructed as turned on in the case of the potential of the pull-up control node PU being greater than a turn-on voltage. As shown in FIG. 2, since the potential of the pull-up control node PU in the first period is smaller than the turn-on voltage of the third thin film transistor T3, the third thin film transistor T3 is turned off. Therefore, the signal of the driving output signal output terminal OUTPUT is at the low level. In addition, in the second and third periods, since the potential of the pull-up control node PU is greater than or equal to the turn-on voltage of the third thin film transistor T3, the third thin film transistor T3 is turned on. Further, under the effect of the signal of the high level direct current signal input terminal DCH connected with the drain of the third thin film transistor T3, as shown in FIG. 2, the potential of the driving output signal output terminal OUTPUT is a half of the potential of the pull-up control node PU.

The pull-down control signal generation module 13 is connected with the high level direct current signal input terminal DCH, the driving input signal input terminal INPUT, the pull-up control node PU, and the pull-down control node PD, and configured to control the potential of the pull-down control node PD according to the driving input signal and the potential of the pull-up control node PU.

Specifically, for example, the pull-down control signal generation module 13 can comprise a fourteenth thin film transistor T14, a fifteenth thin film transistor T15, and a sixteenth thin film transistor T16. Herein, a drain and a gate of the fourteenth thin film transistor T14 are connected with the high level direct current signal input terminal DCH, and a source thereof is connected with the pull-down control node PD. Thus, if the fifteenth thin film transistor T15 or the sixteenth thin film transistor T16 is not turned on, then the pull-down control node PD maintains at the high level.

A drain of the fifteenth thin film transistor T15 is connected with the pull-down control node PD, a gate thereof is connected with the driving input signal input terminal INPUT, and a source thereof is connected with the low level signal input terminal VSS. Thus, in the case of the signal of the driving input signal input terminal INPUT being at the high level, the fifteenth thin film transistor T15 is turned on, thereby being capable of controlling the pull-down control node PD to the low level. In addition, a drain of the sixteenth thin film transistor is connected with the pull-down control node PD, a gate thereof is connected with the pull-up control node PU, and a source thereof is connected with the low level signal input terminal VSS. Thus, in the case of the pull-up control node PU being at the high level, the sixteenth thin film transistor T16 is turned on, thereby being capable of controlling the pull-down control node PD to the low level.

As shown in FIG. 2, in the first to third periods, the signal of the driving input signal input terminal INPUT becomes the high level and/or the signal of the pull-up control node PD becomes the high level, and thus in the first to third periods, the pull-down control node PD is controlled at the low level. In addition, in other periods (for example, a fourth period), both the signal of the driving input signal input terminal INPUT and the signal of the pull-up control node PD are at the low level, so that the fifteenth thin film transistor T15 and the sixteenth thin film transistor T16 are turned off, and thus the pull-down control node PD maintains at the high level under the effect of the high level direct current signal.

In addition, during operation of the shift register unit 1, the signal of the driving input signal input terminal INPUT and the signal of the pull-up control node PD are generally maintained at the low level, which causes that the pull-down control node PD has been maintained at the low level for a long time, that is, the duty ratio of the pull-down control node PD is very high (approximately 99.7%). Of course, the numerical value of the duty ratio is just for illustration, and is actually related with a number of shift register units comprised in the gate driving device and a connection manner of the gate driving device and the display panel.

Returning to FIG. 1, the pull-down module 14 is connected with the pull-down control node PD, and configured to pull down the driving output signal according to the potential of the pull-down control node PD.

Specifically, the pull-down module 14 comprises a seventeenth thin film transistor T17 and an eighteenth thin film transistor T18. In this embodiment, a drain of the seventeenth thin film transistor T17 is connected with the driving output signal output terminal OUTPUT, a source thereof is connected with the low level signal input terminal VSS, and a gate thereof is connected with the pull-down control node PD. Thus, when the pull-down control node PD is at the high level, the seventeenth thin film transistor T17 is turned on, and thus the driving output signal output terminal OUTPUT is capable of maintaining at the low level effectively.

Additionally, in this embodiment, a drain of the eighteenth thin film transistor T18 is connected with the pull-up control node PU, a source thereof is connected with the low level signal input terminal VSS, and a gate thereof is connected with the pull-down control node PD. Thus, when the pull-down control node PD is at the high level, the eighteenth thin film transistor T18 is turned on, and thus the potential of the pull-up control node PU is capable of maintaining at the low level effectively. As described above, when the pull-up control node PU is at the low level, since the potential of the pull-up control node PU is smaller than the turn-on voltage of the third thin film transistor T3, the signal of the driving output signal output terminal OUTPUT maintains at the low level effectively.

As shown in FIG. 2, in other periods (for example, a fourth period) except for the first to third periods, the signal of the driving output signal output terminal OUTPUT maintains at the low level effectively under the effect of the pull-down module 14.

Additionally, description is given in this embodiment by taking the pull-down module 14 pulling down the pull-up control node PU and the driving output signal output terminal OUTPUT simultaneously as an example, but the present disclosure does not limited thereto, and only the pull-up control node PU or the driving output signal output terminal OUTPUT can be pulled down according to the requirements. At this time, the pull-down module 14 can also comprise only the seventeenth thin film transistor T17 or the eighteenth thin film transistor T18.

Figure 3:
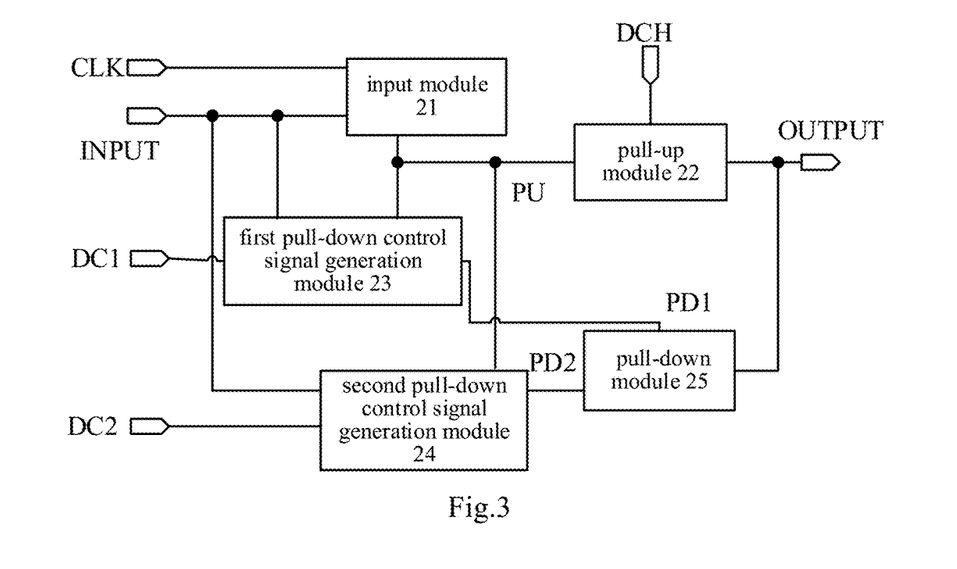
FIG. 3 is a function block diagram of a shift register unit of an implementation of the present disclosure.
Figure 4:
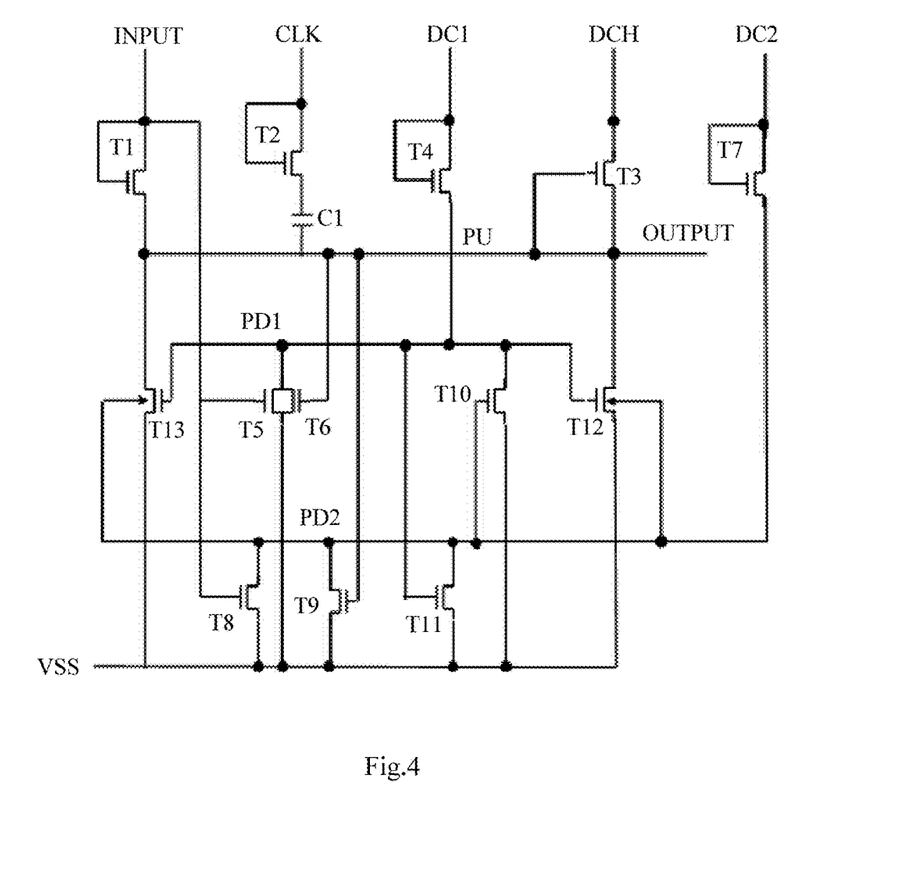
FIG. 4 is a specific circuit diagram of a shift register unit of an embodiment of the present disclosure.

Shift register units according to some alternative implementations according to the present disclosure will be described below by referring to FIGS. 3 to 6. FIG. 3 is a function block diagram of a shift register unit of an implementation of the present disclosure. FIG. 4 is a circuit diagram of a shift register unit of an exemplary embodiment of the present disclosure.

As shown in FIG. 3, a shift register unit 2 according to an implementation of the present disclosure comprises an input module 21, a pull-up module 22, a first pull-down control signal generation module 23, a second pull-down control signal generation module 24 and a pull-down module 25. Herein, a gate driving device in a display device can be constructed by configuring a plurality of shift register units 2 in the implementation of the present disclosure.

In FIG. 3, the input module 21 is connected with a driving input signal input terminal INPUT, a clock signal input terminal CLK, and a pull-up control node PU, and configured to control the potential of the pull-up control node PU according to the driving input signal INPUT and the clock signal CLK.

Referring to FIG. 4, the input module 21 can comprise a first thin transistor T1, a second thin film transistor T2, and a capacitor C1. Herein, the connection structure of the first thin film transistor T1, the second thin film transistor T2 and the capacitor C1 is the same as that in FIG. 2, and thus no further description is given herein.

The driving input signal and the clock signal can be delivered to the pull-up control node PU through the first thin film transistor T1 and the second thin film transistor T2. In addition, through the capacitor C1, the potential of the pull-up control node PU is capable of being controlled to be equal to the potential gained by adding the signal of the driving input signal input terminal INPUT to the signal of the clock signal input terminal CLK.

An operation process of the circuit of the shift register unit as shown in FIG. 4 will be described below by referring to the waveform diagram of FIG. 5. In the first and second periods, since the signal of the clock signal input terminal CLK is at the low level, the second thin film transistor T2 is turned off, and thus the potential of the pull-up control node PU is the same as the signal of the driving input signal input terminal INPUT. In the third period, since the signal of the clock signal input terminal CLK is at the high level, the second thin film transistor T2 is turned on, and thus the potential of the pull-up control node PU is controlled as being equal to the potential gained by adding the signal of the driving input signal input terminal INPUT to the signal of the clock signal input terminal CLK under the effect of the capacitor C1. According to FIG. 5, it can be known that the potential of the pull-up control node PU in the third period is two times of the potential of the pull-up control node PU in the second period. In the description of the implementation of the present disclosure, in order to make it convenient for description, the start period in which the driving input signal becomes the high level is called as the first period.

Herein, the input module 21 of the implementation of the present disclosure is not limited to the structure as shown in FIG. 4, and can also adopt other structures. For example, the input module is composed of other elements (for example, a diode), or the input module 21 is constructed in other connection manners, only if the input module 21 is capable of delivering the signal of the driving input signal input terminal INPUT and the signal of the clock signal input terminal CLK to the pull-up control node.

Furthermore, in the case of the input module 21 being constructed as shown in FIG. 4, optionally, in the first to second periods, the driving input signal becomes the high level, and then in the third period, the signal input from the clock signal input terminal CLK becomes the high level. That is, a period in which the clock signal becomes the high level is set as a period subsequent to the period in which the driving input signal becomes the high level. Thus, a driving output signal after the driving input signal is shifted can be generated conveniently through the pull-up module 22 described below.

The pull-up module 22 is connected with the high level direct current signal input terminal DCH, the pull-up control node PU, and the driving output signal output terminal OUTPUT, and configured to pull down the driving output signal according to the potential of the pull-up control node PU. Referring to FIG. 4, the pull-up module 22 comprises for example the third thin film transistor T3. Herein, the connection structure of the third thin film transistor T3 is the same as that in FIG. 2, and thus no further description is given herein.

The driving output signal after the driving input signal is shifted is output from the driving output signal output terminal OUTPUT according to the potential of the pull-up control node PU by the third thin film transistor T3. For example, the third thin film transistor T3 can be constructed as turned on in the case that the potential of the pull-up control node PU is greater than the turn-on voltage. As shown in FIG. 5, since the potential of the pull-up control node PU in the first period is smaller than the turn-on voltage of the third thin film transistor T3, the third thin film transistor T3 is turned off. Therefore, the signal of the driving output signal output terminal OUTPUT is at the low level. In addition, in the second and third periods, since the potential of the pull-up control node PU is greater than or equal to the turn-on voltage of the third thin film transistor T3, the third thin film transistor T3 is turned on. Further, under the effect of the signal of the high level direct current signal input terminal DCH connected with the drain of the third transistor T3, as shown in FIG. 5, the potential output from the driving output signal output terminal OUTPUT is a half of the potential of the pull-up control node PU.

Herein, the pull-up module 22 of the implementation of the present disclosure is not limited to the structure as shown in FIG. 4, and other structures can also be adopted. For example, the pull-up module is composed of other elements (for example, a diode) or the pull-up module 22 is constructed in other connection manners, only if the pull-up module 22 is capable of outputting the driving output signal after the driving input signal is shifted from the driving output signal output terminal OUTPUT according to the potential of the pull-up control node PU.

For example, in the pull-up module 22 as shown in FIG. 4, the turn-on voltage of the third thin film transistor T3 is set as being greater than the potential of the pull-up control node PU in the first period, so that the function of shifting the driving output signal is realized. However, an appropriate driving output signal can also be generated according to the potential of the pull-up control node PU in other manners or by means of other circuits. For another example, in the pull-up module as shown in FIG. 4, by connecting the pull-up control node PU with the driving output signal output terminal OUTPUT, it is capable of obtaining, in the second and third periods, the driving output signal whose potential is a half of the potential of the pull-up control node PU. Of course, a capacitor can also be disposed between the pull-up control node PU and the driving output signal output terminal OUTPUT, so that an appropriate driving output signal is generated according to the potential of the pull-up control node PU.

Additionally, in the shift register unit 1 described in connection with FIGS. 1 and 2, the duty ratio of the pull-down control node PD is very high, and is at the high level for a long time. Thus, the thin film transistors (for example, the seventeenth thin film transistor T17) constituting the pull-down module 16 are in a turn-on state for a long time, thereby resulting in that the thin film transistors constituting the pull-down module 16 become aging easily. When the thin film transistors constituting the pull-down module 16 is aging, the stability of the shift register unit 1 cannot be ensured, thereby making bad influence on the stability of operation of the gate driving device and the display device.

Relatively, in the implementation as shown in FIG. 3 of the present disclosure, the first pull-down control signal generation module 23 and the second pull-down control signal generation module 24 are adopted to generate a pull-down control signal respectively, and the pull-down module 25 pulls down the driving output signal under the control of the pull-down control signal generated by the first pull-down control signal generation module 23 and the second pull-down control signal generation module 24. Thus, it is capable of effectively avoiding the duty ratio of the potential of the pull-down control node from becoming too high, thereby being capable of avoiding the thin film transistors constituting the pull-down module 25 from being in the turn-on state for a long time. Thus, it is capable of avoiding the thin film transistors constituting the pull-down module 25 from aging quickly, and raising the stability of the shift register unit 2.

As shown in FIG. 3, the first pull-up control signal generation module 23 is connected with the first signal input terminal DC1, the driving input signal input terminal INPUT, the pull-up control node PU, and the first pull-down control node PD1, and configured to control the potential of the first pull-down control node PD1 according to the driving input signal and the potential of the pull-up control node when the first signal DC1 is in a high level period.

For example, referring to FIG. 4, the first pull-down control signal generation module 23 can comprise a fourth thin film transistor T4, a fifth thin film transistor T5 and a sixth thin film transistor T6. Herein, a drain and a gate of the fourth thin film transistor T4 are connected with the first signal input terminal DC1, and a source thereof is connected with the first pull-down control node PD1; a drain of the fifth thin film transistor T5 is connected with the first pull-down control node PD1, a gate thereof is connected with the driving input signal input terminal INPUT, and a source thereof is connected with the low level signal input terminal VSS; and a drain of the sixth thin film transistor T6 is connected with the first pull-down control node PD1, a gate thereof is connected with the pull-up control node PU, and a source thereof is connected with the low level signal input terminal VSS.

Thus, in the implementation of the present disclosure, when the first signal DC1 is at the high level, the fourth thin film transistor T4 is turned on, so that in the case of the fifth thin film transistor T5 and the sixth thin film transistor T6 being turned off, the first pull-down control node PD1 is maintained at the high level. During the period that the first signal DC1 is at the high level, in the case that the signal of the driving input signal input terminal INPUT is at the high level, the fifth thin film transistor T5 is turned on, so that it is capable of controlling the first pull-down control node PD1 at the low level. Also, during the period that the first signal is at the high level, in the case that the pull-up control node PU is at the high level, the sixth thin film transistor T6 is turned on, so that it is capable of controlling the first pull-down control node PD1 at the low level.

Figure 5:
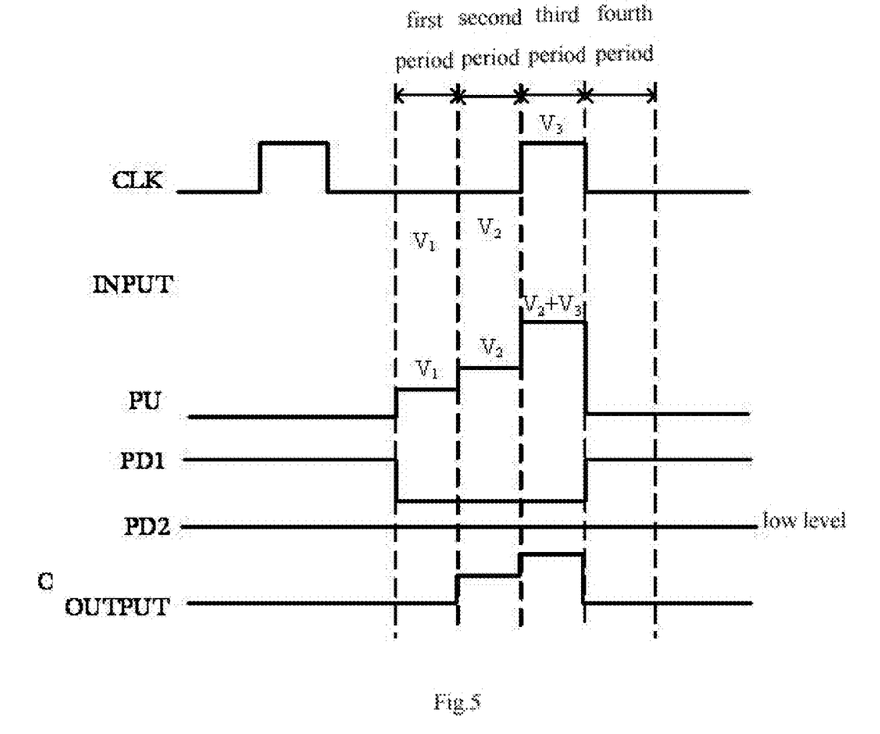
FIG. 5 is a waveform diagram of nodes in the circuit of the shift register unit as shown in FIG. 4.

In FIG. 5, waveforms of respective nodes are shown by taking the case of the first signal DC1 being at the high level as an example. Referring to FIG. 5, in the first to third periods, the signal of the driving input signal input terminal INPUT becomes the high level and/or the signal of the pull-up control node PD becomes the high level, and thus in the first to third periods, the first pull-down control node PD1 is controlled to the low level. In addition, in other periods (for example, the fourth period), both the signal of the driving input signal input terminal INPUT and the signal of the pull-up control node PD are at the low level, so that the fifth thin film transistor T5 and the sixth thin film transistor T6 are turned off and thus the first pull-down control node PD1 is maintained at the high level under the effect of the high level direct current signal.

Herein, the first pull-down control signal generation module 23 of the implementation of the present disclosure is not limited to the structure as shown in FIG. 4, and other structures can also be adopted. For example, the first pull-down control signal generation module 23 is composed of other elements (for example, a diode), and the first pull-down control signal generation module 23 can also be constructed in other connection manners, only if the first pull-down control signal generation module 23 controls the potential of the first pull-down control node PD1 according to the driving input signal and the potential of the pull-up control node during the period that the first signal DC1 is at the high level.

The second pull-down control signal generation module 24 is connected with the second signal input terminal DC2, the driving input signal input terminal INPUT, the pull-up control node PU, and the second pull-up control node PD2, and configured to control the potential of the second pull-down control node according to the driving input signal and the potential of the pull-up control node during the period that the second signal DC2 is at the high level.

For example, referring to FIG. 4, the second pull-down control signal generation module 24 comprises a seventh thin film transistor T7, an eighth thin film transistor T8, and a ninth thin film transistor T9. Herein, a drain and a gate of the seventh thin film transistor T7 are connected with the second signal input terminal DC2, and a source thereof is connected with the second pull-down control node PD2; a drain of the eighth thin film transistor T8 is connected with the second pull-down control node PD2, a gate thereof is connected with the driving input signal input terminal INPUT, and a source thereof is connected with the low level signal input terminal VSS; and a drain of the ninth thin film transistor T8 is connected with the second pull-down control node PD2, a gate thereof is connected with the pull-up control node PU, and a source thereof is connected with the low level signal input terminal VSS.

Thus, in the implementation of the present disclosure, when the second signal DC2 is at the high level, the seventh thin film transistor T7 is turned on, so that in the case of the eighth thin film transistor T8 and the ninth thin film transistor T9 being turned off, the second pull-down control node PD2 is maintained at the high level. During the period that the second signal DC2 is at the high level, in the case of the signal of the driving input signal input terminal INPUT being at the high level, the eighth thin film transistor T8 is turned on, so that it is capable of controlling the second pull-down control node PD2 to the low level. Also, during the period that the second signal is at the high level, in the case of the pull-up control node PU being at the high level, the ninth thin film transistor T9 is turned on, so that it is capable of controlling the second pull-down control node PD2 to the low level.

In the waveform diagram as shown in FIG. 5, waveforms of respective nodes are shown by taking the case of the first signal DC1 being at the high level and the second signal DC2 being at the low level as an example. Referring to FIG. 5, since the second signal DC2 is at the low level, the seventh thin film transistor T7 is turned off, and thus the second pull-down control node PD2 is maintained at the low level. Assuming that the second signal DC2 is at the high level, being the same as the first pull-down control node PD1, the second pull-down control node PD2 becomes the low level in the first to third periods, and is maintained at the high level in other periods (for example, the fourth period).

Herein, the second pull-down control signal generation module 24 of the implementation of the present disclosure is not limited to the structure as shown in FIG. 4, and other structures can also be adopted. For example, the second pull-down control signal generation module 24 is composed of other elements (for example, a diode), or the second pull-down control signal generation module 24 is constructed in other connection manners, only if the second pull-down control signal generation module 24 controls the potential of the second pull-down control node PD2 according to the driving input signal and the potential of the pull-up control node during the period that the second signal DC2 is at the high level.

Figure 6:
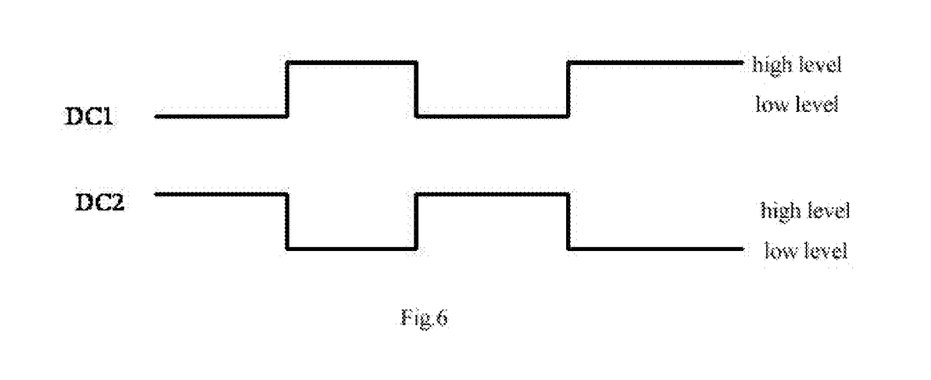
FIG. 6 is a waveform diagram of nodes in the circuit of the shift register unit as shown in FIG. 4.

In the implementation of the present disclosure, the first signal DC1 and the second signal DC2 become the high level alternatively. Specifically, as shown in FIG. 6, at a moment when the first signal DC1 is at the high level, the second signal DC2 is at the low level. In contrast, at a moment when the first signal DC1 is at the low level, the second signal DC2 is at the high level. In FIG. 6, waveforms of the first signal DC1 and the second signal DC2 are shown by taking the duty ratios of the first signal DC1 and the second signal DC2 being 50% respectively as an example. However, in the implementation of the present disclosure, the duty ratios of the first signal DC1 and the second signal DC2 can also be adjusted, only if it is capable ensuring that the first signal DC1 and the second DC2 become the high level alternatively.

As described above, the first pull-down control signal generation module 23 carries out the action during the period that the first signal is at the high level, and the second pull-down control signal generation module 24 carries out the action when the second signal is at the high level. Therefore, in the case of the first signal DC1 and the second signal DC2 becoming the high level alternatively, the first pull-down control signal generation module 23 and the second pull-down control signal generation module 24 carry out the action alternatively.

In order to ensure that the first pull-down control signal generation module 23 and the second pull-down control signal generation module 24 carry out the action alternatively, in the implementation of the present disclosure, optionally, the first pull-down control signal generation module 23 comprises a tenth thin film transistor T10, and the second pull-down control signal generation module 24 comprises an eleventh thin film transistor T11.

Referring to FIG. 4, a drain of the tenth thin film transistor T10 is connected with the first pull-down control node PD1, a gate thereof is connected with the second pull-down control node PD2, and a source thereof is connected with the low level signal input terminal VSS. A drain of the eleventh thin film transistor T11 is connected with the second pull-down control node PD2, a gate thereof is connected with the first pull-down control node PD1, and a source thereof is connected with the low level signal input terminal VSS.

Thus, when the second signal becomes the high level while the second pull-down control node PD2 becomes the high level, the tenth thin film transistor T10 is turned on, and at the same time, the second pull-down control signal generation module 24 operates. When the tenth thin film transistor T10 is turned on, it is capable of maintaining the first pull-down control node PD1 at the low level effectively, so as to ensure that the first pull-down control signal generation module 23 does not operate. Also, when the first signal becomes the high level while the first pull-up control node PD1 becomes the high level, the eleventh thin film transistor T11 is turned on, and at the same time the first pull-down control signal generation module 23 operates. When the tenth thin film transistor T11 is turned on, it is capable of maintaining the second pull-down control node PD2 at the low level effectively, so as to ensure that the second pull-down control signal generation module 24 does not operate.

As described above, the first pull-down control signal generation module 23 comprises the tenth thin film transistor T10, and second pull-down control signal generation module 24 comprises the eleventh thin film transistor T11, so that when the first signal DC1 and the second signal DC2 become the high level alternatively, it is capable of ensuring reliably that the first pull-down control signal generation module 23 and the second pull-down control signal generation module 24 operate alternatively.

The pull-down module 25 is connected with the first pull-down control node PD1 and the second pull-down control node PD2, and configured to pull down the driving output signal according to the potential of the first pull-down control node and the potential of the second pull-down control node.

Referring to FIG. 4, the pull-down module 25 comprises a twelfth thin film transistor T12. A drain of the twelfth thin film transistor T12 is connected with the driving output signal output terminal OUTPUT, a source thereof is connected with the low level signal input terminal VSS, a first gate thereof is connected with the first pull-down control node PD1, and a second gate thereof is connected with the second pull-down control node PD2. Herein, the twelfth thin film transistor T12 is a dual-gate thin film transistor. Therefore, in the case of the first gate or the second gate being applied the high level, the twelfth thin film transistor T12 is turned on.

Specifically, in the structure as shown in FIG. 4, in the case that the first pull-down control node PD1 becomes the high level or the second pull-down control node PD2 becomes the high level, the twelfth thin film transistor T12 is turned on, so that the driving output signal output terminal OUTPUT is capable of being maintained at the low level effectively.

For example, as shown in the waveform diagram in FIG. 5, in other periods (e.g. the fourth period) except for the first to third periods, the first pull-down control node PD1 is at the high level. Therefore, under the effect of the pull-down module 25, the signal of the driving output signal output terminal OUTPUT is maintained at the low level effectively.

As described above, although the first pull-down control signal generation module 23 and the second pull-down control signal generation module 24 operate alternatively, the pull-down module 25 is capable of pulling down the driving output signal according to the potential of the first pull-down control node PD1 and the potential of the second pull-down control node simultaneously, thereby being capable of pulling down the driving output signal effectively. That is, in the case of the first pull-down control node PD1 becoming the high level or the second pull-down control node PD2 becoming the high level, the pull-down module 25 pulls down the driving output signal. Therefore, action of pulling down is carried out according to the first pull-down control node PD1 during the period that the first signal DC1 is at the high level, and action of pulling down is carried out according to the second pull-down control node PD2 during the period that the second signal DC2 is at the high level.

Additionally, the pull-down module 25 in the implementation of the present disclosure is not limited to the structure as shown in FIG. 4, and other structures can also be adopted, only if the pull-down module 25 is capable of pulling down the driving output signal according to the potential of the first pull-down control node and the potential of the second pull-down control node.

Optionally, the pull-down module 25 in the implementation of the present disclosure further comprises a thirteenth thin film transistor T13. Referring to FIG. 4, a drain of the thirteen thin film transistor T13 is connected with the pull-up control node PU, a source thereof is connected with the low level signal input terminal VSS, a first gate thereof is connected with the first pull-down control node PD1, and a second gate thereof is connected with the second pull-down control node PD2.

Specifically, when the first pull-down control node PD1 is at the high level or the second pull-down control node PD2 is at the high level, the thirteenth thin film transistor T13 is turned on, and thus the potential of the pull-up control node PU is capable of maintaining at the low level effectively. As described above, when the pull-up control node PU is at the low level, the potential of the pull-up control node PU is smaller than the turn-on voltage of the third thin film transistor T3, such that the signal from the driving output signal output terminal OUTPUT is maintained at the low level effectively.

As described above, in the shift register unit 2 according to the implementation of the present disclosure, since the first signal DC1 and the second signal DC2 become the high level alternatively, so that the first pull-down control signal generation module 23 and the second pull-down control signal generation module control the first pull-down control node PD1 and the second pull-down control node PD2 alternatively. Then, the pull-down module 25 is capable of pulling down the driving output signal according to the first pull-down control node PD1 and the second pull-down control node PD2. That is, during the period that the first signal is at the high level, the pull-down module 25 is capable of pulling down the driving output signal according to the potential of the first pull-down control node PD1; and during the period that the second signal is at the high level, the pull-down module 25 is capable of pulling down the driving output signal according to the potential of the second pull-down control node PD2.

Thus, in the implementation of the present disclosure, the first pull-down control node PD1 is at the low level during the period that the second signal DC2 is at the high level, and thus the duty ratio of the first pull-down control node PD1 could be controlled to be not very high. For example, the duty ratio of the first pull-down control node PD1 is slightly smaller than the duty ratio of the first signal DC1, and is approximately equal to 50% in the scenario as shown in FIG. 6. Also, the second pull-down control node PD2 is at the low level during the period that the first signal DC1 is at the high level, and thus the duty ratio of the second pull-down control node PD2 could be controlled to be not very high. For example, the duty ratio of the second pull-down control node PD2 is slightly smaller than the duty ratio of the second signal DC1, and is approximately equal to 50% in the scenario as shown in FIG. 6. In this way, it is capable of avoiding a certain node PN of the dual-gate thin film transistor constituting the pull-down module 25 as shown in FIG. 4 from being in the turn-on state for a long period, and is capable of avoiding the thin film transistor from aging fast. Thus, the stability of the shift register unit, the gate driving device and the display device can be improved.

Figure 7:
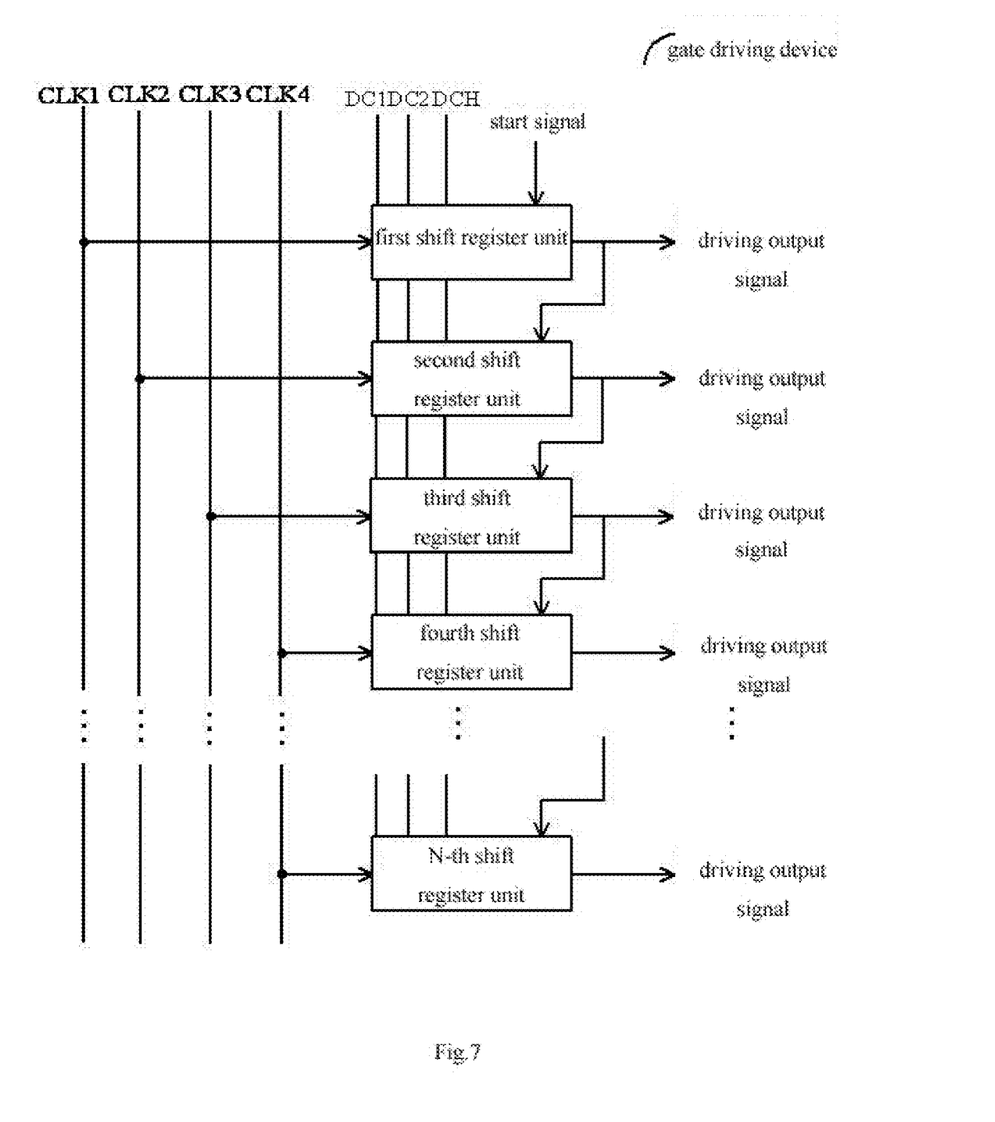
FIG. 7 is a function block diagram of a gate driving device comprising a shift register unit of an implementation of the present disclosure.

A gate driving device according to an implementation of the present disclosure will be described below by referring to FIG. 7. FIG. 7 shows a function block diagram of the gate driving device comprising the shift register unit according to the implementation of the present disclosure.

As shown in FIG. 7, the gate driving device of the implementation of the present disclosure comprises N shift register units, where N is a natural integer greater than 1. Furthermore, each shift register unit comprised in the gate driving device can adopt the structure as described above.

In the structure of the gate driving device as shown in FIG. 7, a driving input signal input terminal of a n-th shift register unit is connected with a driving output signal output terminal of a (n−1)-th shift register unit, where 1<n<=N. That is, the driving output signal of the (n−1)-th shift register unit is input to the n-th shift register unit as a driving input signal. In addition, a driving input signal input terminal of the first shift register unit is connected with an input terminal of a start signal.

Thus, driving output signals output from the first to N-th shift register units sequentially become the driving output signals shifted periodically from the start signal.

Furthermore, in the respective shift register units comprised in the gate driving device as shown in FIG. 7, the first signal, the second signal, and the high level direct current signal are received respectively, so that the driving output signal gained after the driving input signal is shifted is output according to the received signal.

Figure 8:
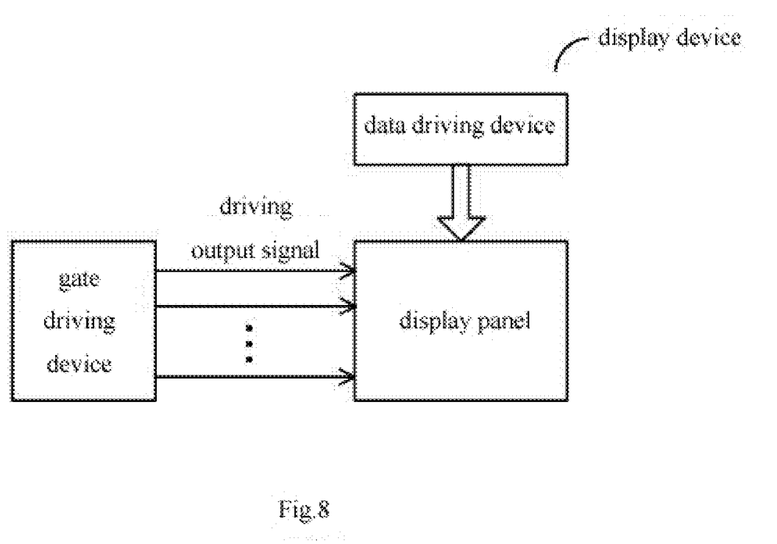
FIG. 8 is a function block diagram of a display device comprising a gate driving device of an embodiment of the present disclosure.

A function block diagram of a display device comprising the gate driving device according to an implementation of the present disclosure will be described below by referring to FIG. 8. FIG. 8 is a function block diagram of the display device comprising the gate driving device according to the implementation of the present disclosure.

As shown in FIG. 8, the display device comprises a display panel, and a gate driving device. In addition, in the display device as shown in FIG. 8, other devices can be configured according to the requirement. For example, as shown in FIG. 8, the display device can further comprise a data driving device.

The gate driving device comprised in the display device of FIG. 8 can adopt the structure as shown in FIG. 7. The respective shift register units comprised in the gate driving device are configured to turn on/turn off the thin film transistors of corresponding rows of the pixel region of the display panel. Specifically, when the driving output signal output by the shift register unit becomes the high level, the thin film transistors of the corresponding row are turned on. Since the respective shift register units output the shifted driving output signals sequentially, the thin film transistors of respective rows in the display panel are turned on sequentially, so that the turned-on thin film transistors are capable of controlling brightness or the like according to the signal output by the data driving device.

Figure 9:
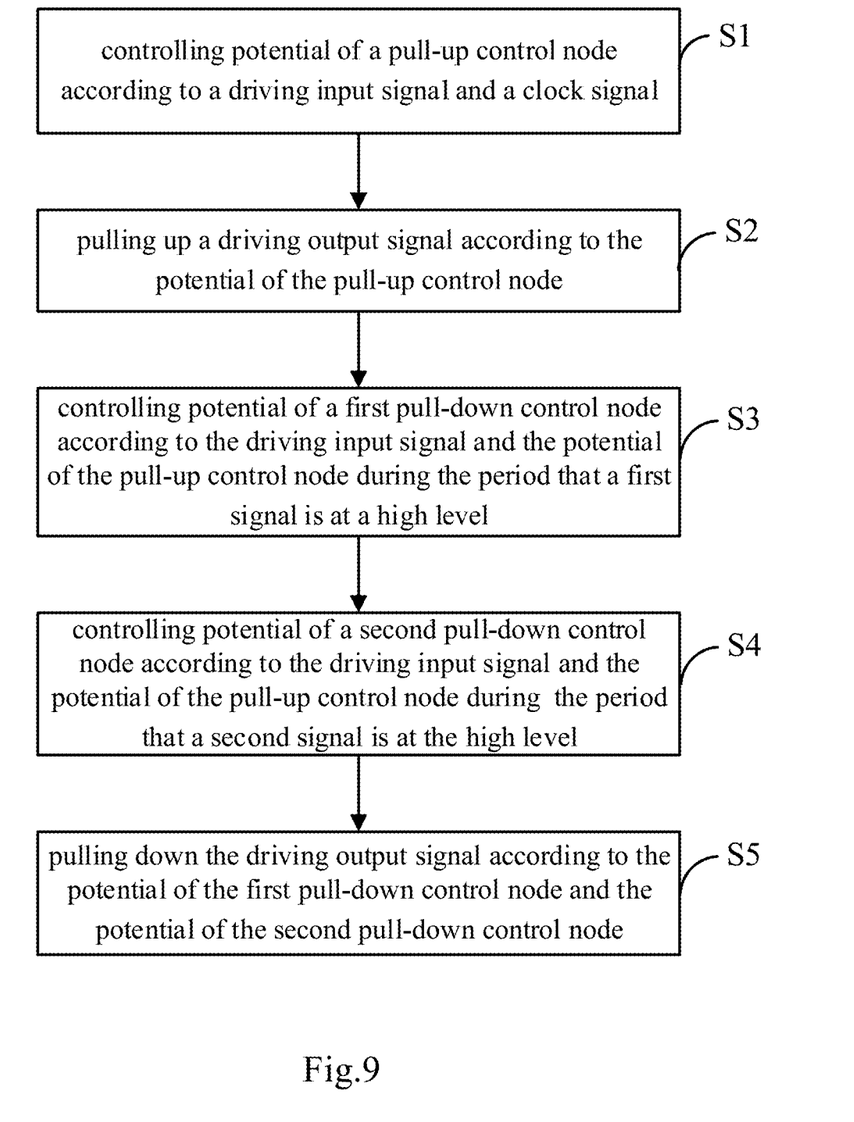
FIG. 9 is a flow diagram representing a control method of a shift register unit of an implementation of the present disclosure.

FIG. 9 is a flow diagram of a control method of a shift register unit according to an implementation of the present disclosure. The control method applied to the shift register unit according to the implementation of the present disclosure will be described below by referring to FIG. 9.

In step S1, the potential of the pull-up control node is controlled according to the driving input signal and the clock signal.

Specifically, in the case of being applied to the shift register unit 2 as shown in FIG. 2, the input module 21 is connected with the driving input signal input terminal INPUT, the clock signal input terminal CLK, and the pull-up control node PU, and configured to control the potential of the pull-up control node PU according to the driving input signal INPUT and the clock signal CLK. For example, the input module 21 can comprise the first thin film transistor T1, the second thin film transistor T2, and the capacitor C1.

The driving input signal and the clock signal can be delivered to the pull-up control node PU through the first thin film transistor T1 and the second thin film transistor T2. In addition, through the capacitor C1, the potential of the pull-up control node PU can be controlled as a potential after the signal of the driving input signal terminal INPUT is added to the signal of the clock signal terminal CLK.

In step S2, the driving output signal is pulled up according to the potential of the pull-up control node.

Specifically, in the case of being applicable to the shift register unit 2 as shown in FIG. 2, the pull-up module 22 is connected with the high level direct current signal input terminal DCH, the pull-up control node PU, and the driving output signal output terminal OUTPUT, and configured to pull up the driving output signal according to the potential of the pull-up control node PU. For example, the pull-up module 22 comprises the third thin film transistor T3.

The driving output signal gained after the driving input signal is shifted is output from the driving output signal output terminal OUTPUT according to the potential of the pull-up control node PU through the third thin film transistor T3. For example, the third thin film transistor T3 is constructed as turned on in the case of the potential of the pull-up control node PU being greater than the turn-on voltage. As shown in FIG. 5, since the potential of the pull-up control node PU in the first period is smaller than the turn-on voltage of the third thin film transistor T3, the third thin film transistor T3 is turned off. Therefore, the signal output from the driving output signal output terminal OUTPUT is at the low level. In addition, in the second and third periods, since the potential of the pull-up control node PU is greater than or equal to the turn-on voltage of the third thin film transistor T3, the third thin film transistor T3 is turned on. Further, under the effect of the signal of the input terminal DCH of the high level direct current signal connected with the drain of the third thin film transistor T3, as shown in FIG. 5, the potential of the driving output signal output terminal OUTPUT is a half of the potential of the pull-up control node PU.

In step S3, during the period that the first signal is at the high level, the potential of the first pull-down control node is controlled according to the driving input signal and the potential of the pull-up control node.

Specifically, in the case of being applied to the shift register unit 2 as shown in FIG. 2, the first pull-down control signal generation module 23 is connected with the input terminal DC1 of the first signal, the driving input signal input terminal INPUT, the pull-up control node PU, and the first pull-down control node PD1, and configured to control the potential of the first pull-down control node PD1 according to the driving input signal and the potential of the pull-up control node during the period that the first signal DC1 is at the high level.

For example, the first pull-down control signal generation module 23 comprises a fourth thin film transistor T4, a fifth thin film transistor T5 and a sixth thin film transistor T6. When the first signal is at the high level, the fourth thin film transistor T4 is turned on, so that the first pull-down control node PD1 is maintained at the high level in the case of the fifth thin film transistor T5 and the sixth thin film transistor T6 being turned off. During the period that the first signal is at the high level, in the case of the signal of the driving input signal input terminal INPUT being at the high level, the fifth thin film transistor T5 is turned on, thereby being capable of controlling the first pull-down control node PD1 at the low level. Also, during the period that the first signal is at the high level, in the case of the pull-up control node PU being at the high level, the sixth thin film transistor T6 is turned on, thereby being capable of controlling the first pull-down control node PD1 at the low level.

In step S4, during the period that the second signal is at the high level, the potential of the second pull-down control node is controlled according to the driving input signal and the potential of the pull-up control bode.

Specifically, in the case of being applied to the shift register unit 2 as shown in FIG. 2, the second pull-down control signal generation module 24 is connected with the input terminal DC2 of the second signal, the driving input signal input terminal INPUT, the pull-up control node PU, and the second pull-down control node PD2, and configured to control the potential of the second pull-down control node according to the driving input signal and the potential of the pull-up control node during the period that the second signal DC2 is at the high level.

The second pull-down control signal generation module 24 comprises seventh thin film transistor T7, an eighth thin film transistor T8, and a ninth thin film transistor T9. When the second signal is at the high level, the seventh thin film transistor T7 is turned on thereby maintaining the second pull-down control node PD2 at the high level in the case of the eighth thin film transistor T8 and the ninth thin film transistor T9 being turned off. During the period that the second signal is at the high level, in the case of the signal of the driving input signal input terminal INPUT being at the high level, the eighth thin film transistor T8 is turned on, thereby being capable of controlling the second pull-down control node PD2 to the low level. Also, during the period the second signal is at the high level, in the case of the pull-up control node PU being at the high level, the ninth thin film transistor T9 is turned on, thereby the second pull-down control node PD2 can be controlled at the low level.

In the implementation of the present disclosure, the first signal and the second signal become the high level alternatively. Specifically, as shown in FIG. 6, at the moment when the first signal DC1 is at the high level, the second signal DC2 is at the low level. In contrast, at the moment when the first signal DC1 is at the low level, the second signal DC2 is at the high level. In the case of the shift register unit 2 as sown in FIG. 2, the first pull-down control signal generation module 23 carries out the action during the period that the first signal is at the high level, and the second pull-down control signal generation module 24 carries out the action during the period that the second signal is at the high level. Therefore, in the case of the first signal DC1 and the second signal DC2 becoming the high level alternatively, the first pull-down control signal generation module 23 and the second pull-down control signal generation module 24 carry out the action alternatively.

In step S5, the driving output signal is pulled down according to the potential of the first pull-down control node and the potential of the second pull-down control node.

Specifically, in the case of being applied to the shift register unit 2 as shown in FIG. 2, the pull-down module 25 is connected with the first pull-down control node PD1 and the second pull-down control node PD2, and configured to pull down the driving output signal according to the potential of the first pull-down control node and the potential of the second pull-down control node. For example, the pull-down module 25 comprises a twelfth thin film transistor T12. In the case of the first pull-down control node PD1 becoming the high level or the second pull-down control node PD2 becoming the high level, the twelfth thin film transistor T12 is turned on, so that the driving output signal output terminal OUTPUT is capable of being maintained at the low level effectively. For example, as shown in the waveform diagram of FIG. 5, in other periods (for example, the fourth period) except for the first to third periods, the first pull-down control node PD1 is at the high level, and thus under the effect of the pull-down module 25, the signal of the driving output signal output terminal OUTPUT is maintained at the low level effectively.

Thus, the pull-down module 25 is capable of pulling down the driving output signal according to the potential of the first pull-down control node PD1 and the potential of the second pull-down control node PD2 simultaneously, thereby being capable of pulling down the driving output signal effectively. That is, the pull-down module 25 pulls down the driving output signal in the case of the first pull-down control node PD1 becoming at the high level or the second pull-down control node PD2 becoming at the high level. Therefore, the action of pulling down is carried out according to the first pull-down control node PD1 during the period that the first signal is at the high level, and the action of pulling down is carried out according to the second pull-down control node PD2 during the period that the second signal is at the high level.

In addition, the pull-down module 25 can further comprise a thirteenth thin film transistor T13. When the first pull-down control node PD1 is at the high level or the second pull-down control node PD2 is at the high level, the thirteenth thin film transistor T13 is turned on, and thus the potential of the pull-up control node PU is capable of maintaining at the low level effectively. When the pull-up control node PU is at the low level, the potential of the pull-up control node PU is smaller than the turn-on voltage of the third thin film transistor, such that the signal of the driving output signal output terminal OUTPUT maintains at the low level effectively.

According to control method according to the implementation of the present disclosure, since the first signal and the second signal become the high level alternatively, it is capable of controlling the first pull-down control node and the second pull-down control node alternatively. Then, the driving output signal is pulled down according to the first pull-down control node and the second pull-down control node. That is, during the period that the first signal is at the high level, it is capable of pulling down the driving output signal according to the potential of the first pull-down control node; during the period that the second signal is at the high level, it is capable of pulling down the driving output signal according to the potential of the second pull-down control node.

Thus, in the implementation of the present disclosure, the first pull-down control node is at the low level when the second signal becomes the high level, and thus the duty ratio of the first pull-down control node is capable of being controlled to be not very high. Also, the second pull-down control node PD2 is at the low level during the period that the first signal DC1 is at the high level, and thus the duty ratio of the second pull-down control node is capable of being controlled to be not very high. In this way, it is capable of avoiding a certain node PN of the dual-gate thin film transistor constituting the pull-down module 25 as shown in FIG. 4 from being in the turn-on state for a long period, and is capable of avoiding the thin film transistor from aging fast. Thus, stability of the shift register unit, the gate driving device and the display device can be improved.

Respective implementations of the present disclosure are described above in detail. However, those skilled in the art shall understand that various amendments, combination or sub-combinations can be made to these implementations without departing from the principle and spirit of the present disclosure, and these amendments shall fall into the scope of the present disclosure.

The present application claims the priority of a Chinese patent application No. 201510684372.5 filed on Oct. 20, 2015. Herein, the content disclosed by the Chinese patent application is incorporated in full by reference as a part of the present disclosure.

What is claimed is:

1. A shift register unit, comprising:
    an input module, connected with a driving input signal input terminal, a clock signal input terminal, and a pull-up control node, and configured to control potential of the pull-up control node according to a driving input signal and a clock signal;
    a pull-up module, connected with a high level direct current signal input terminal, the pull-up control node, and a driving output signal output terminal, and configured to pull up a driving output signal according to the potential of the pull-up control node;
    a first pull-down control signal generation module, connected with a first signal input terminal, the driving input signal input terminal, the pull-up control node and a first pull-down control node, and configured to control potential of the first pull-down control node according to the driving input signal and the potential of the pull-up control node during a period that a first signal is at a high level;
    a second pull-down control signal generation module, connected with a second signal input terminal, the driving input signal input terminal, the pull-up control node, and a second pull-down control node, and configured to control potential of the second pull-down control node according to the driving input signal and the potential of the pull-up control node during a period that a second signal is at a high level, wherein the first signal and the second signal become a high level alternatively; and
    a pull-down module, connected with the first pull-down control node and the second pull-down control node, and configured to pull down the driving output signal according to the potential of the first pull-down control node and the potential of the second pull-down control node.

2. The shift register unit according to claim 1, wherein the input module comprises:
    a first thin film transistor, whose drain and gate are connected with the driving input signal input terminal, and source is connected with the pull-up control node;
    a second thin film transistor, whose drain and gate are connected with the clock signal input terminal; and
    a capacitor, whose one terminal is connected with a source of the second thin film transistor and another terminal is connected with the pull-up control node.

3. The shift register unit according to claim 1, wherein the pull-up module comprises:
    a third thin film transistor, whose drain disconnected with the high level direct current signal input terminal, gate is connected with the pull-up control node, and source is connected with the driving output signal output terminal.

4. The shift register unit according to claim 1, wherein, the first pull-down control signal generation module comprises:
    a fourth thin film transistor, whose drain and gate are connected with the first signal input terminal, and source is connected with the first pull-down control node;
    a fifth thin film transistor, whose drain is connected with the first pull-down control node, gate is connected with the driving input signal input terminal, and source is connected with a low level signal input terminal; and
    a sixth thin film transistor, whose drain is connected with the first pull-down control node, gate is connected with the pull-up control node, and source is connected with the low level signal input terminal.

5. The shift register unit according to claim 4, wherein the first pull-down control signal generation module further comprises:

the tenth thin film transistor, whose drain is connected with the first pull-down control node, gate is connected with the second pull-down control node, and source is connected with the low level signal input terminal.

6. The shift register unit according to claim 1, wherein the second pull-down control signal generation module comprises:
a seventh thin film transistor, whose drain and gate are connected with the second signal input terminal, and source is connected with the second pull-down control node;
an eighth thin film transistor, whose drain is connected with the second pull-down control node, gate is connected with the driving input signal input terminal, and source is connected with the low level signal input terminal; and
a ninth thin film transistor, whose drain is connected with the second pull-down control node, gate is connected with the pull-up control node, and source is connected with the low level signal input terminal.

7. The shift register unit according to claim 6, wherein the second pull-down control signal generation module further comprises:
an eleventh thin film transistor, whose drain is connected with the second pull-down control node, gate is connected with the first pull-down control node, and source is connected with the low level signal input terminal.

8. The shift register unit according to claim 1, wherein the pull-down module comprises:
a twelfth thin film transistor, whose drain is connected with the driving output signal output terminal, source is connected with the low level signal input terminal, first gate is connected with the first pull-down control node, and second gate is connected with the second pull-down control node.

9. The shift register unit according to claim 8, wherein the pull-down module comprises:
a thirteenth thin film transistor, whose drain is connected with the pull-up control node, source is connected with the low level signal input terminal, first gate is connected with the first pull-down control node, and second gate is connected with the second pull-down control node.

10. A gate driving device, comprising:
N shift register units according to claim 1,
where N is a natural number greater than 1,
the driving input signal input terminal of the n-th shift register unit is connected with the driving output signal output terminal of the (n−1)-th shift register unit, where 1<n<=N, and
the driving input signal input terminal of the first shift register unit is connected with an output terminal of a start signal.

11. A display device, comprising:
a display panel; and
the gate driving device according to claim 10 which is configured to output a driving output signal to the display panel.

12. The gate driving device according to claim 10, wherein
the input module comprises:
a first thin film transistor, whose drain and gate are connected with the driving input signal input terminal, and source is connected with the pull-up control node;
a second thin film transistor, whose drain and gate are connected with the clock signal input terminal; and
a capacitor, whose one terminal is connected with a source of the second thin film transistor and another terminal is connected with the pull-up control node.

13. The gate driving device according to claim 10, wherein
the pull-up module comprises:
a third thin film transistor, whose drain disconnected with the high level direct current signal input terminal, gate is connected with the pull-up control node, and source is connected with the driving output signal output terminal.

14. The gate driving device according to claim 10, wherein,
the first pull-down control signal generation module comprises:
a fourth thin film transistor, whose drain and gate are connected with the first signal input terminal, and source is connected with the first pull-down control node;
a fifth thin film transistor, whose drain is connected with the first pull-down control node, gate is connected with the driving input signal input terminal, and source is connected with a low level signal input terminal; and
a sixth thin film transistor, whose drain is connected with the first pull-down control node, gate is connected with the pull-up control node, and source is connected with the low level signal input terminal.

15. The gate driving device according to claim 14, wherein
the first pull-down control signal generation module further comprises:
the tenth thin film transistor, whose drain is connected with the first pull-down control node, gate is connected with the second pull-down control node, and source is connected with the low level signal input terminal.

16. The gate driving device according to claim 10, wherein
the second pull-down control signal generation module comprises:
a seventh thin film transistor, whose drain and gate are connected with the second signal input terminal, and source is connected with the second pull-down control node;
an eighth thin film transistor, whose drain is connected with the second pull-down control node, gate is connected with the driving input signal input terminal, and source is connected with the low level signal input terminal; and
a ninth thin film transistor, whose drain is connected with the second pull-down control node, gate is connected with the pull-up control node, and source is connected with the low level signal input terminal.

17. The gate driving device according to claim 16, wherein
the second pull-down control signal generation module further comprises:
an eleventh thin film transistor, whose drain is connected with the second pull-down control node, gate is connected with the first pull-down control node, and source is connected with the low level signal input terminal.

18. The gate driving device according to claim 10, wherein
the pull-down module comprises:
a twelfth thin film transistor, whose drain is connected with the driving output signal output terminal, source is connected with the low level signal input terminal, first gate is connected with the first pull-down control node, and second gate is connected with the second pull-down control node.

19. The gate driving device according to claim 18, wherein the pull-down module comprises:
a thirteenth thin film transistor, whose drain is connected with the pull-up control node, source is connected with the low level signal input terminal, first gate is connected with the first pull-down control node, and second gate is connected with the second pull-down control node.

20. A control method applicable to the shift register unit according to claim 1, comprising:

controlling potential of the pull-up control node according to the driving input signal and the clock signal;

pulling up the driving output signal according to the potential of the pull-up control node; controlling potential of the first pull-down control node according to the driving input signal and the potential of the pull-up control node during a period that the first signal is at a high level;

controlling potential of the second pull-down control node according to the driving input signal and the potential of the pull-up control node during a period that the second signal is at a high level, wherein the first signal and the second signal become the high level alternatively; and pulling down the driving output signal according to the potential of the first pull-down control node and the potential of the second pull-down control node.

\* \* \* \* \*